United States Patent
Hatol et al.

(10) Patent No.: US 12,256,517 B2
(45) Date of Patent: Mar. 18, 2025

(54) REVERSIBLE FAN ASSEMBLY WITH PRESS FIT STABILIZATION

(71) Applicant: Advanced Energy Industries, Inc., Denver, CO (US)

(72) Inventors: Angelito Hatol, Antipolo (PH); Lorenzo Nool, San Jose del Monte (PH)

(73) Assignee: Advanced Energy Industries, Inc., Denver, CO (US)

( * ) Notice: Subject to any disclaimer, the term of this patent is extended or adjusted under 35 U.S.C. 154(b) by 178 days.

(21) Appl. No.: 18/057,829

(22) Filed: Nov. 22, 2022

(65) Prior Publication Data
US 2024/0172390 A1    May 23, 2024

(51) Int. Cl.
*H05K 7/20* (2006.01)
*F04D 29/60* (2006.01)

(52) U.S. Cl.
CPC ....... *H05K 7/20172* (2013.01); *F04D 29/602* (2013.01)

(58) Field of Classification Search
CPC ........................... H05K 7/20172; F04D 29/602
See application file for complete search history.

(56) References Cited

U.S. PATENT DOCUMENTS

| | | | | |
|---|---|---|---|---|
| 6,236,564 B1 * | 5/2001 | Fan | ............... | H05K 7/20581 312/236 |
| 7,048,498 B2 * | 5/2006 | Kosugi | ............... | F04D 29/663 415/214.1 |
| 7,068,505 B2 * | 6/2006 | Kosugi | ............... | F04D 29/663 165/122 |
| 7,661,923 B2 * | 2/2010 | Kosugi | ............... | F04D 29/601 220/837 |
| 7,684,191 B1 * | 3/2010 | Willis | ............... | G06F 1/20 361/695 |
| 8,223,493 B2 * | 7/2012 | Ye | ............... | G06F 1/20 361/679.48 |
| 8,602,380 B2 * | 12/2013 | Sun | ............... | G06F 1/18 415/213.1 |
| 8,734,102 B2 * | 5/2014 | Sun | ............... | G06F 1/20 415/213.1 |
| 2011/0158791 A1 * | 6/2011 | Li | ............... | G06F 1/20 415/119 |
| 2012/0216993 A1 * | 8/2012 | Sun | ............... | F04D 29/601 165/121 |
| 2014/0055952 A1 * | 2/2014 | Sun | ............... | H05K 7/20727 361/695 |

FOREIGN PATENT DOCUMENTS

CN            102999125 B     6/2016

* cited by examiner

*Primary Examiner* — Robert J Hoffberg

(57) ABSTRACT

A fan assembly comprises first and second fans and a first press fit stabilizer. The first and second fans comprise housings having a plurality of fastener apertures formed in a first side thereof the first housing. The first press fit stabilizer comprises a plurality of press fit tabs. The first fan is coupled to the second fan via a first press fit tab of the plurality of press fit tabs inserted into a first fastener aperture of the plurality of fastener apertures of the first housing and via a second press fit tab of the plurality of press fit tabs inserted into a first fastener aperture of the plurality of fastener apertures of the second housing.

19 Claims, 4 Drawing Sheets ures 104. In particular, each fan 101, 102 may have four
REVERSIBLE FAN ASSEMBLY WITH PRESS FIT STABILIZATION

TECHNICAL FIELD

Aspects of the disclosure relate to air cooling, and more particularly to cooling air fans providing cooling air flow for electronic components.

BACKGROUND

Electronic components such as power supplies, power converters, servers, and the like typically use cooling air flowing across heat generating components to control heat created during operation. In a typical scenario, one or more fans are mounted to a chassis wall of an enclosure and are operated to force cooling air from outside the chassis and through the fan assembly toward the chassis internal components or to draw cooling air across chassis internal components toward the fan assembly for dissipation outside the enclosure.

FIG. 1 illustrates a fan assembly 100 including a pair of fans 101, 102 coupleable to a bracket assembly 103 for securing the fans 101, 102 to a chassis (not shown). As illustrated, each fan 101, 102 includes a plurality of fastener apertures 104. In particular, each fan 101, 102 may have four fastener apertures 104 on a first side 105 and an additional four fastener apertures 104 on an opposite side 106. The bracket assembly 103 includes a lower bracket 107 for supporting four fasteners 108 coupleable to the two lower fastener apertures 104 of the first side 105 the fan 101 and to the two lower fastener aperture 104 of the first side 105 of the fan 102. An upper fastener 109 of the bracket assembly 103 is configured to secure the inside upper fastener apertures 104 of the first sides 105 of the fans 101, 102 together. A wire assembly 110 with a connector 111 is routed about the fans 101, 102 to allow the connector 111 to connect to a mating connector (not shown) for operating the fans 101, 102.

In some scenarios, the mounting of the fan assembly 100 to direct cooling air in an initial direction is desired to be changed so that the cooling air direction may flow in the opposite direction. For example, an end customer may purchase a product with the fans blowing cooling air from outside the chassis toward the internal components. The end customer may alternatively desire the cooling air to be drawn through the chassis and expelled through the fans. Accordingly, the end customer may direct a technician to rotate the orientation of the fans 101, 102 to swap the position of the first and second sides 105, 106. Due to the mounting nature of the fan assembly 100, multiple parts are required to be disassembled and reassembled when changing the orientation. Further, manipulation and re-routing of the wire assembly 110 through the fans 101, 102 is also required to adjust the position of the connector 111 to the opposite side to align with its mating connector.

It would be advantageous to simplify the procedure for assembling the fan assembly and for switching the fan direction to reduce the time needed to perform these tasks.

SUMMARY

In accordance with one aspect of the present disclosure, a fan assembly comprises first and second fans and a first press fit stabilizer. The first fan comprises a first housing and a first impeller positioned within the first housing, the first housing having a first plurality of fastener apertures formed in a first side of the first housing. The second fan comprises a second housing and a second impeller positioned within the second housing, the second housing having a first plurality of fastener apertures formed in a first side of the second housing. The first press fit stabilizer comprises a plurality of press fit tabs. The first fan is coupled to the second fan via a first press fit tab of the plurality of press fit tabs inserted into a first fastener aperture of the first plurality of fastener apertures of the first housing and via a second press fit tab of the plurality of press fit tabs inserted into a first fastener aperture of the first plurality of fastener apertures of the second housing.

In accordance with one aspect of the present disclosure, a method of coupling a fan assembly to an enclosure comprises positioning a first fan adjacently to a second fan, each of the first and second fans comprising a housing having a first plurality of fastener apertures formed in a first side thereof, wherein a first upper fastener aperture of the housing of the first fan is adjacent to a first upper fastener aperture of the housing of the second fan, and wherein a first lower fastener aperture of the housing of the first fan is adjacent to a first lower fastener aperture of the second fan. The method also comprises aligning a first press fit tab of a first press fit stabilizer with the first upper fastener aperture of the first fan, aligning a second press fit tab of the first press fit stabilizer with the first upper fastener aperture of the second fan, aligning a third press fit tab of the first press fit stabilizer with the first lower fastener aperture of the first fan, and aligning a fourth press fit tab of the first press fit stabilizer with the first lower fastener aperture of the second fan. The method also comprises pressing the first, second, third, and fourth press fit tabs into the first upper and lower fastener apertures and coupling the housings of the first and second fans to a fan wall of the enclosure via coupling a respective fastener through the fan wall to each of a second upper fastener aperture of the first fan, a second upper fastener aperture of the second fan, a second lower fastener aperture of the first fan, and a second lower fastener aperture of the second fan.

BRIEF DESCRIPTION OF THE DRAWINGS

The drawings illustrate embodiments presently contemplated for carrying out the invention.

In the drawings.

Figure 1:
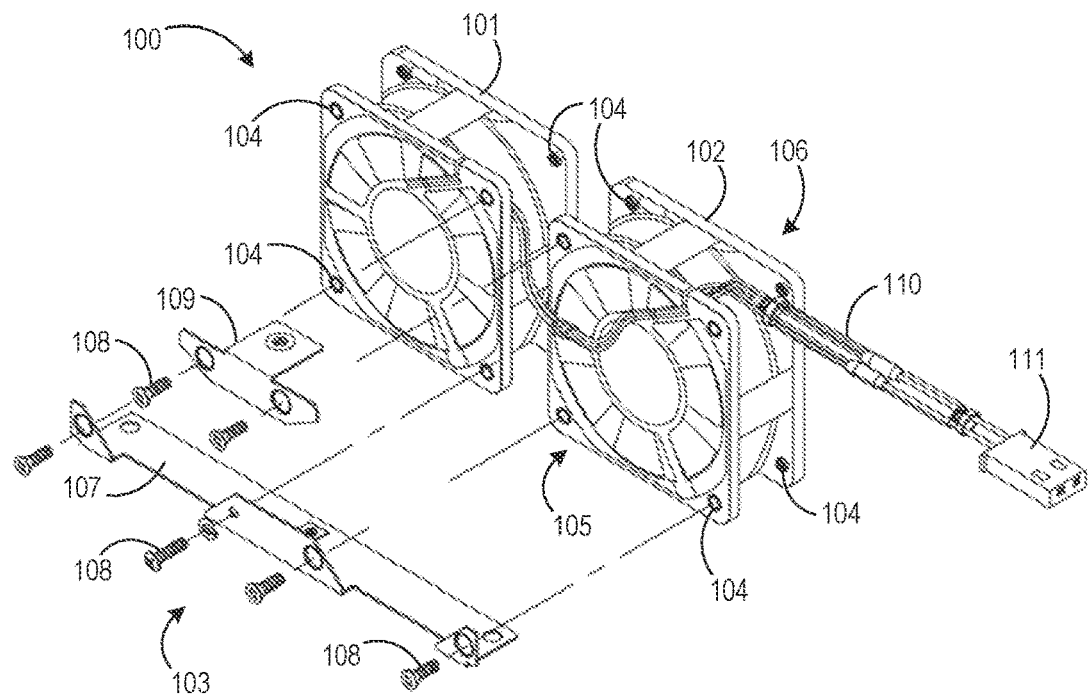
FIG. 1 is an isometric view of a known fan assembly.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

Figure 2:
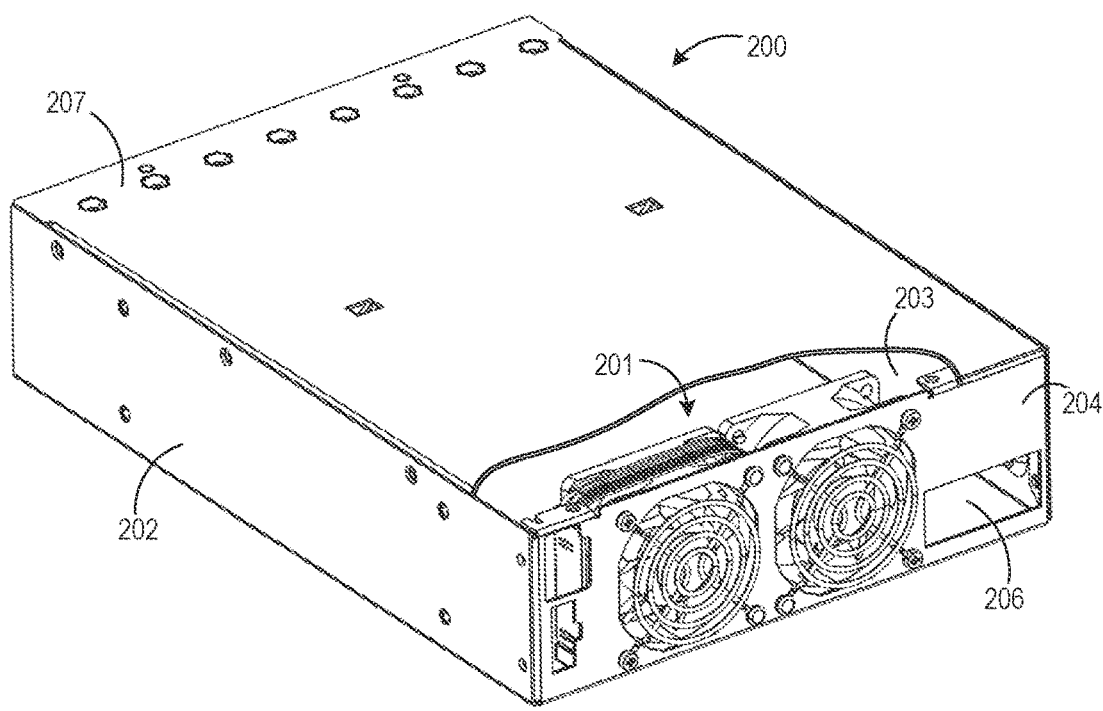
FIG. 2 is an isometric view of an enclosure housing a fan assembly according to an embodiment.
Figure 3:
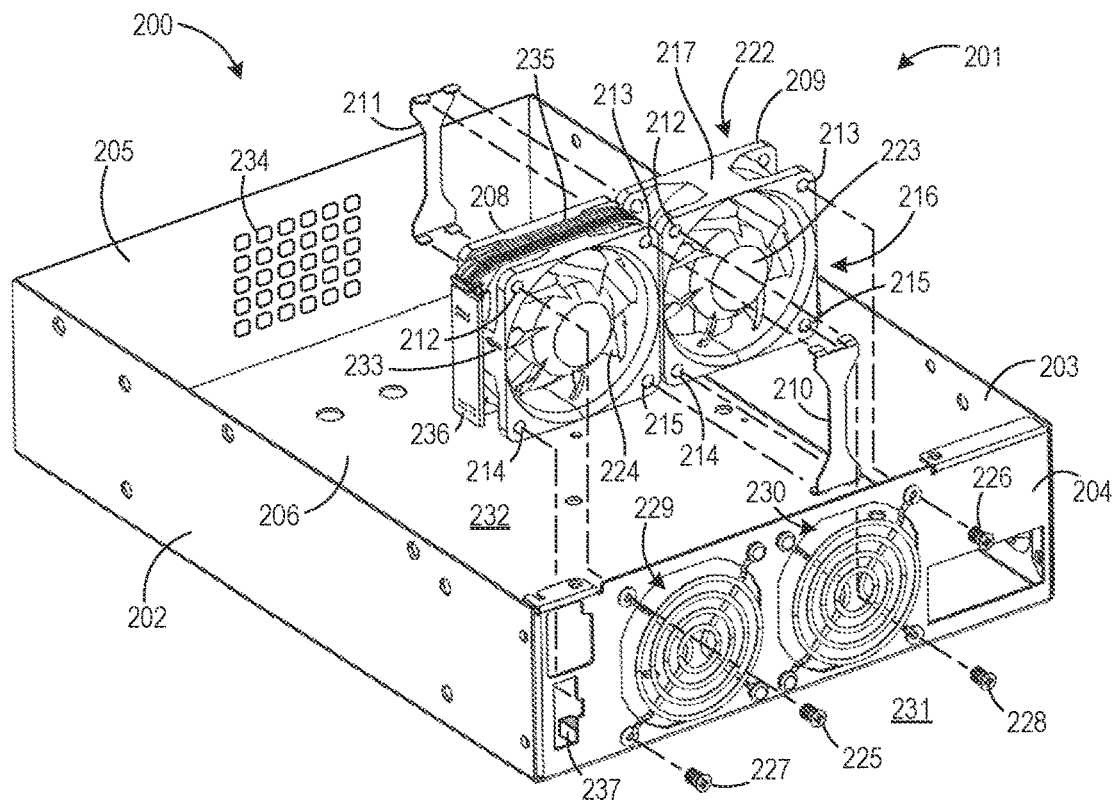
FIG. 3 is an isometric partial exploded view of the enclosure of FIG. 2 according to an embodiment.

FIGS. 2 and 3 respectively illustrate an isometric view and a partial exploded view of an enclosure 200 housing a fan assembly 201 according to an embodiment. Referring to both FIGS. 2 and 3, the enclosure 200 includes a pair of side walls 202, 203, a fan wall 204, an end wall 205, a bottom cover 206, and a top cover 207. A cutaway portion of the top cover 207 illustrates the fan assembly 201 mounted to the fan wall 204.

The fan assembly 201 includes a pair of fans 208, 209 and a pair of press fit stabilizers 210, 211. Both fans 208, 209 include four fastener apertures 212, 213, 214, 215 on a first side 216 of a fan housing or stator 217 and adjacent to respective corners of the fan housing 217 on the first side 216 and another four fastener apertures 218, 219, 220, 221 (see FIG. 7) on a second side 222 of the fan housing 217 and adjacent to respective corners of the fan housing 217 on the second side 222. A rotating impeller 223 is positioned within the fan housing 217 and has a plurality of fins 224 configured to generate a cooling air flow as the impeller 223 rotates with respect to the fan housing 217. A motor (not shown) attached to the fan housing 217 and to the impeller 223 provides rotating control of the impeller 223 to generate the cooling air flow. With the fan 208 positioned adjacently to fan 209 as illustrated, the upper fastener apertures 213, 212 of respective fans 208, 209 form an inside upper pair of apertures, and the lower fastener apertures 215, 214 of respective fans 208, 209 form an inside lower pair of apertures. As described below, the inside upper and lower pairs of apertures on both sides 216, 222 of the fans 208, 209 receive one of the press-fit tabs 210, 211 to secure the center section of the fan assembly 201. The fan assembly 201 is coupled or fastened to the fan wall 204 via four fasteners 225, 226, 227, 228 secured to respective outer fastener apertures 212, 214 of the fan 208 and outer fastener apertures 213, 215 of the fan 209. In one example, the fasteners 225-228 are threadedly engaged with the outer fastener apertures of the fans 208, 209.

Aligned with the fans 208, 209 when secured to the fan wall 204 are fan openings 229, 230 formed in the fan wall 204 to allow air flow to pass between the fans 208, 209 inside the enclosure 200 and the ambient environment 231 outside the enclosure 200. When oriented as illustrated in FIGS. 2 and 3, cooling air is drawn from the ambient environment 231 and pushed into the interior 232 of the enclosure 200 as indicated by a directional arrow indicator 233 on the side of the fan 208. After passing through the interior of the enclosure 200, the cooling air may exit the interior of the enclosure 200 via an aperture array 234 in the end wall 205 and pass back into the ambient environment 231 in one example. In another example, the enclosure 200 is located between separate environments such that one environment exposed to the fan wall 204 may be warmer or cooler than another environment exposed to the end wall 205.

A wire assembly 235 with connector 236 is routed from between the fans 208, 209 and along a top of the fan 208 such that the connector 236 may connect with a mating connector 237 for controlling the operation of the fans 208, 209. The wire assembly 235 is positioned to avoid complicated routing through the fan 208 to reduce complexity and time during installation and changes of fan orientation.

Figure 4:
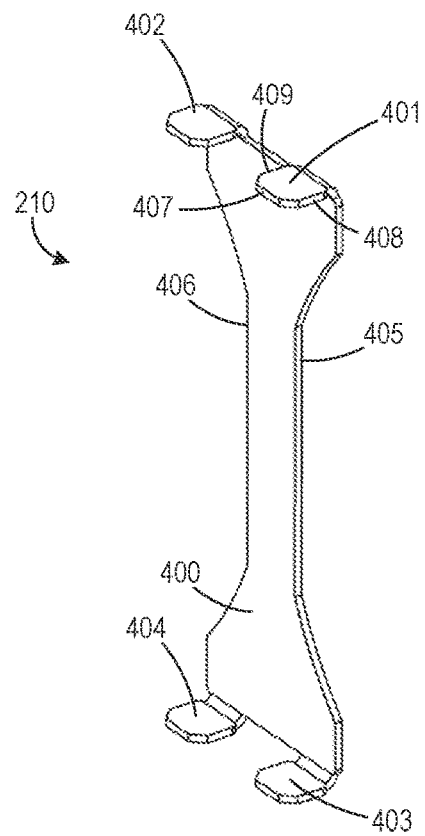
FIG. 4 is an isometric view of a press fit stabilizer of the fan assembly of FIG. 5 according to an embodiment.

FIG. 4 illustrates an isometric view of the press fit stabilizer 210 of the fan assembly 201 according to an embodiment. The other press fit stabilizer 211 may be similarly constructed as described herein.

The press fit stabilizer 210 includes a main body portion 400 and a plurality of upper press fit tabs 401, 402 and a plurality of lower press fit tabs 403, 404 extending from the main body portion 400. In one example, the press fit stabilizer 210 is formed of a single piece of material such as, for example, metal, alloy, plastic, etc. The main body portion 400 is shaped to reduce interaction of the main body portion 400 with cooling air generated by the fans 208, 209. For example, as illustrated, each side 405, 406 of the main body portion 400 is curved in a convex-type shape based on the shape of an overlapping portion of a respective fan 208, 209 to eliminate material that may interfere with the cooling air flowing from the impeller 223 of the fan 208 generating the cooling air flow. The press fit tabs 401-404 extend from the main body portion 400 in a common direction as illustrated in FIG. 4. For example, the press fit tabs 401-404 are bent at 90 degree angles with respect to the main body portion 400 to extend in a left direction as shown in FIG. 4.

Each press fit tab 401-404 includes a leading edge 407 joined with lateral edges 408, 409. The leading and lateral edges 407-409 are configured to be inserted into a fastener aperture (e.g., 212-221) of a respective fan 208, 209 for securing the press fit stabilizer 210 to the respective fan 208, 209. A length of the leading edge 407 may be shorter than a diameter of the fastener apertures 212-221 while a distance between the lateral edges 408, 409 may be optimized to allow a sliding press fit or friction-based coupling of the press fit tab 401-404 to a wall 410 of the respective fastener aperture 212-221 into which it is inserted.

Figure 5:
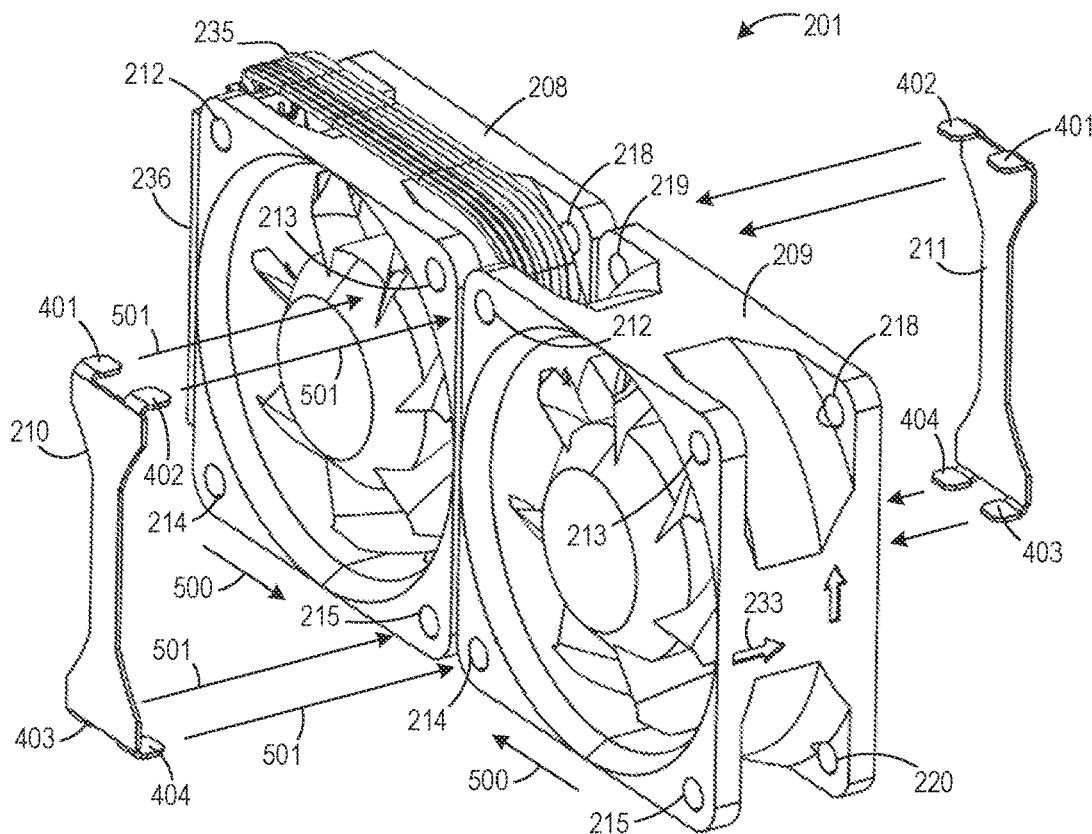
FIG. 5 illustrates a procedure for assembling the fan assemblies of FIGS. 2 and 3 according to an embodiment.

FIG. 5 illustrates a procedure for assembling the fan assembly 201 according to an embodiment. In a first step, the fans 208, 209 are positioned next to one another and adjusted (e.g., arrows 500) so that a spacing between the upper fastener apertures 213, 212 and between the lower fastener apertures 215, 214 allows insertion of the respective press fit tabs 401-404 thereinto. In a subsequent step, the press fit stabilizer 210 may be aligned with and joined with the fans 208, 209 along directions 501 such that press fit tab 401 is inserted into and press fit coupled with fastener aperture 213, press fit tab 402 is inserted into and press fit coupled with fastener aperture 212, press fit tab 403 is inserted into and press fit coupled with fastener aperture 215, and press fit tab 404 is inserted into and press fit coupled with fastener aperture 214. Also in a subsequent step, the press fit stabilizer 211 may be joined with the fans 208, 209 such that press fit tab 401 is aligned with and inserted into and press fit coupled with fastener aperture 219, press fit tab 402 is inserted into and press fit coupled with fastener aperture 218, press fit tab 403 is inserted into and press fit coupled with fastener aperture 221, and press fit tab 404 is inserted into and press fit coupled with fastener aperture 220. When joined as described and illustrated in FIG. 5, the mating connector 237 (FIG. 3) is adjacent to the fan 208. Accordingly, the wire assembly 235 and connector 236 are positioned or routed along the top of the fan 208 to be in a cooperative position for coupling the connector 236 with the mating connector 237.

Figure 6:
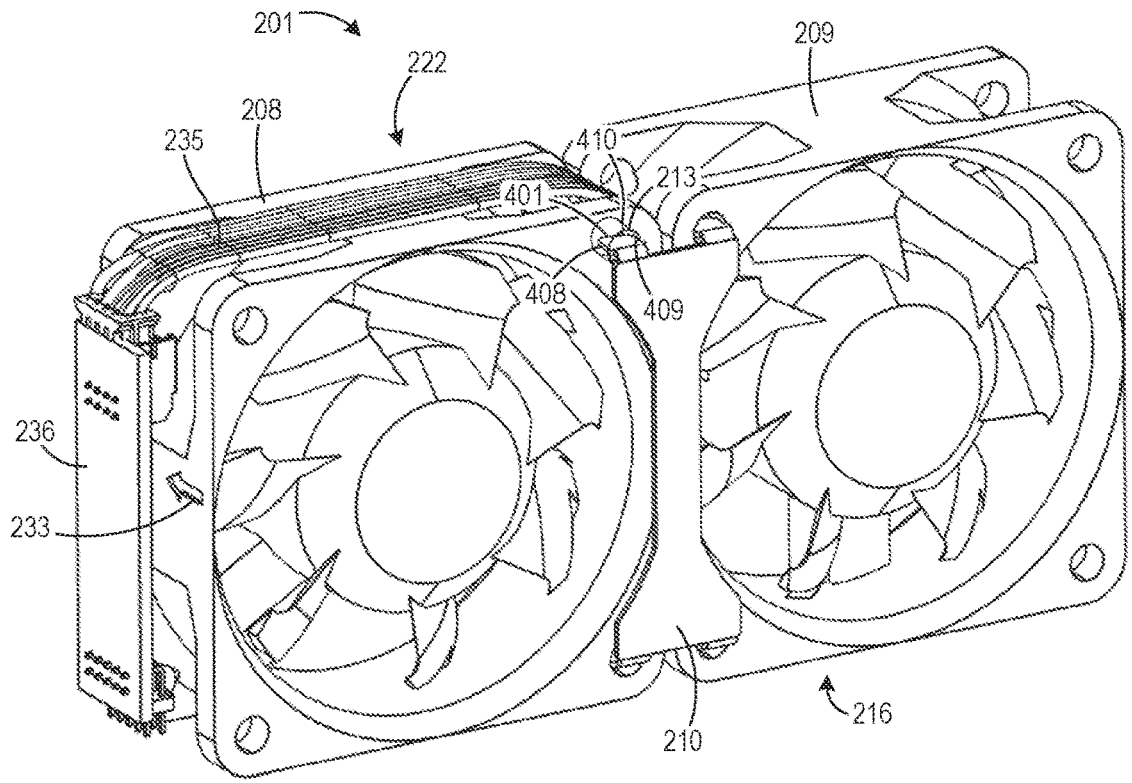
FIG. 6 is an isometric view of the fan assembly of FIG. 5 configured to direct cooling air along a first direction according to an embodiment.

FIG. 6 illustrates the assembled fan assembly 201 of FIG. 5. In particular, the lateral edges 408, 409 of the press fit tab 401 can be seen in the sliding press fit or friction-based coupling arrangement with the wall of the fastener aperture 213. As indicated by the directional arrow indicator 233, when the fan assembly 201 is inserted into and fastened to the enclosure 200 as illustrated in FIGS. 2 and 3, the direction of the cooling air flow through the fans 208, 209 is from the ambient environment 231 toward the interior 232 and the aperture array 234 of the end wall 205.

Figure 7:
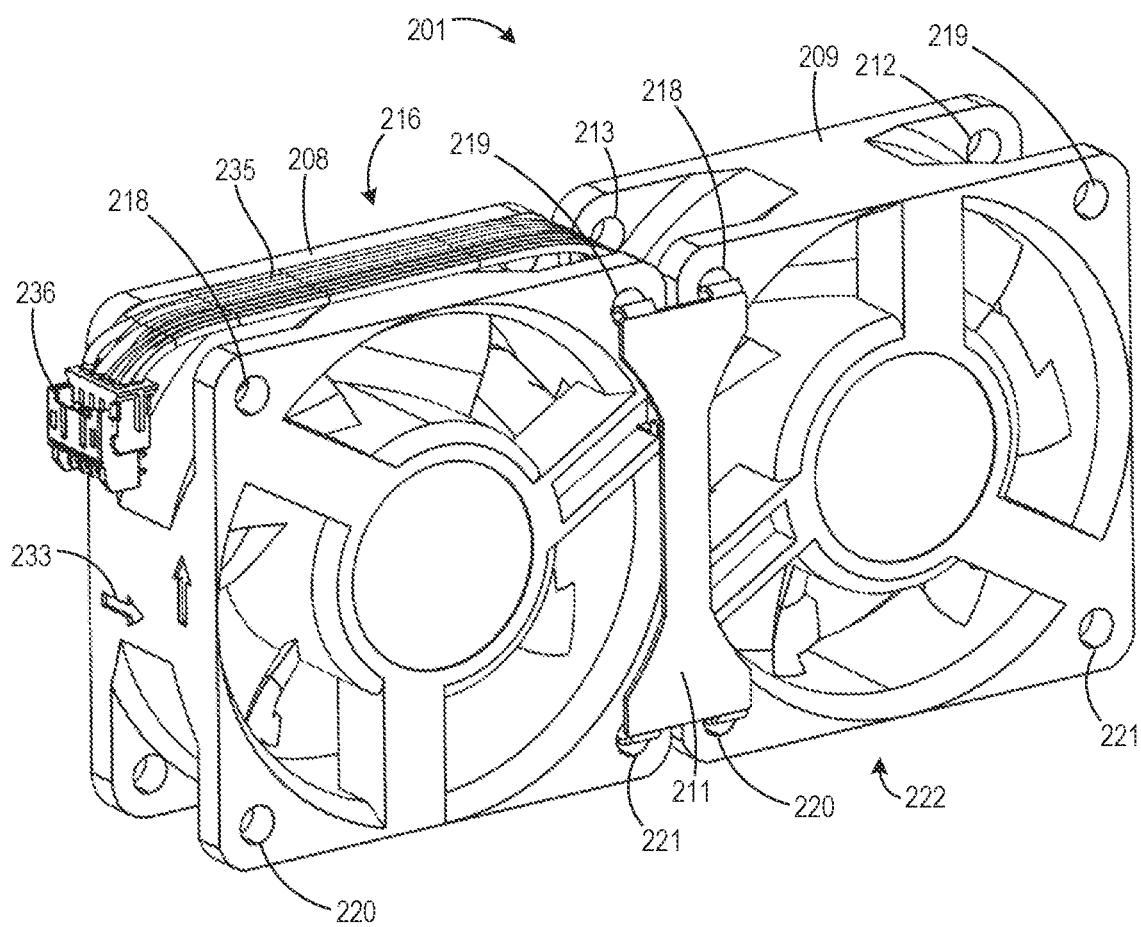
FIG. 7 is an isometric view of the fan assembly of FIG. 5 configured to direct cooling air along a second direction according to an embodiment.

FIG. 7 illustrates a swapped arrangement of the fan assembly 201 such that the cooling air flow as indicated by the directional arrow indicator 233 is drawn through the aperture array 234 of the end wall 205 and through the interior 232 toward the fan assembly 201 and the ambient environment 231. As illustrated, the wire assembly 235 and the connector 236 (a portion thereof not shown in FIG. 7 to enable easier illustration of the directional arrow indicator 233) are positioned on an opposite side of the fan assembly 201 as compared with the fan assembly 201 shown in FIG. 6. The cooling air flow direction may be accomplished by rotating a joined fan assembly 201 or by disassembling a fan assembly and individually rotating the separate fans 208, 209 before rejoining them as described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

The invention claimed is:

1. A fan assembly comprising:
    a first fan comprising a first housing and a first impeller positioned within the first housing, the first housing having a first plurality of fastener apertures formed in a first side of the first housing;
    a second fan comprising a second housing and a second impeller positioned within the second housing, the second housing having a first plurality of fastener apertures formed in a first side of the second housing; and a first press fit stabilizer formed of a single piece of material of a substantially uniform thickness and comprising:
        a main body portion; and
        a plurality of press fit tabs Sort with respect to the main body portion to extend from the main body portion in a common direction, wherein the first fan is coupled to the second fan via:
    a first press fit tab of the plurality of press fit tabs inserted into a first fastener aperture of the first plurality of fastener apertures of the first housing; and
    a second press fit tab of the plurality of press fit tabs inserted into a first fastener aperture of the first plurality of fastener apertures of the second housing.

2. The fan assembly of claim 1, wherein the first press fit tab is coupled to a wall of the first fastener aperture of the first plurality of fastener apertures of the first housing via friction; and
    wherein the second press fit tab is coupled to a wall of the first fastener aperture of the first plurality of fastener apertures of the second housing via friction.

3. The fan assembly of claim 2, wherein each of the first and second press fit tabs comprises:
    a leading edge; and
    a plurality of lateral edges;
    wherein the lateral edges of the first press fit tab are frictionally engaged with the wall of the first fastener aperture of the first plurality of fastener apertures of the first housing; and
    wherein the lateral edges of the second press fit tab are frictionally engaged with the wall of the first fastener aperture of the first plurality of fastener apertures of the second housing.

4. The fan assembly of claim 3, wherein the first plurality of fastener apertures of the first housing further comprises a second fastener aperture configured to be threadedly coupled with a first threaded fastener; and
    wherein the first plurality of fastener apertures of the second housing further comprises a second fastener aperture configured to be threadedly coupled with a second threaded fastener.

5. The fan assembly of claim 1, wherein the first plurality of fastener apertures on the first side of the first housing comprises four fastener apertures including the first fastener aperture of the first housing;
    wherein each of the four fastener apertures on the first side of the first housing is located adjacently to a respective corner of the first side of the first housing;
    wherein the first plurality of fastener apertures on the first side of the second housing comprises four fastener apertures on the first side of the second housing including the first fastener aperture of the second housing; and
    wherein each of the four fastener apertures on the first side of the second housing is located adjacently to a respective corner of the first side of the second housing.

6. The fan assembly of claim 5, wherein the four fastener apertures on the first side of the first housing comprise a pair of upper fastener apertures and a pair of lower fastener apertures;
    wherein the four fastener apertures on the first side of the second housing comprise a pair of upper fastener apertures and a pair of lower fastener apertures; and wherein the pair of upper fastener apertures on the first side of the first housing comprises the first fastener aperture of the first plurality of fastener apertures of the first housing.

7. The fan assembly of claim 6, wherein the pair of upper fastener apertures on the first side of the second housing comprises the first fastener aperture of the first plurality of fastener apertures of the second housing.

8. The fan assembly of claim 7, wherein the first press fit stabilizer further comprises:
   a third press fit tab inserted into a second fastener aperture of the first plurality of fastener apertures of the first housing; and
   a fourth press fit tab inserted into a second fastener aperture of the first plurality of fastener apertures of the second housing.

9. The fan assembly of claim 6, wherein the pair of lower fastener apertures on the first side of the second housing comprises the first fastener aperture of the first plurality of fastener apertures of the second housing.

10. The fan assembly of claim 1 further comprising a second press fit stabilizer comprising a plurality of press fit tabs;
    wherein the first housing further comprises a second plurality of fastener apertures formed in a second side of the first housing;
    wherein the second housing further comprises a second plurality of fastener apertures formed in a second side of the second housing;
    wherein the first fan is further coupled to the second fan via:
      a first press fit tab of the plurality of press fit tabs of the second press fit stabilizer inserted into a first fastener aperture of the second plurality of fastener apertures of the first housing; and
      a second press fit tab of the plurality of press fit tabs of the second press fit stabilizer inserted into a first fastener aperture of the second plurality of fastener apertures of the second housing.

11. A method of coupling a fan assembly to an enclosure comprising:
    positioning a first fan adjacently to a second fan, each of the first and second fans comprising a housing having a first plurality of fastener apertures formed in a first side thereof and a single impeller positioned within the housing, wherein a first upper fastener aperture of the housing of the first fan is adjacent to a first upper fastener aperture of the housing of the second fan, and wherein a first lower fastener aperture of the housing of the first fan is adjacent to a first lower fastener aperture of the second fan;
    aligning a first press fit tab of a first press fit stabilizer with the first upper fastener aperture of the first fan;
    aligning a second press fit tab of the first press fit stabilizer with the first upper fastener aperture of the second fan;
    aligning a third press fit tab of the first press fit stabilizer with the first lower fastener aperture of the first fan;
    aligning a fourth press fit tab of the first press fit stabilizer with the first lower fastener aperture of the second fan;
    pressing the first, second, third, and fourth press fit tabs into a respective one of the first upper and lower fastener apertures of either the first fan or the second fan; and
    coupling the housings of the first and second fans to a fan wall of the enclosure via coupling a respective fastener through the fan wall to each of a second upper fastener aperture of the first fan, a second upper fastener aperture of the second fan, a second lower fastener aperture of the first fan, and a second lower fastener aperture of the second fan.

12. The method of claim 11, wherein the first, second, third, and fourth press fit tabs are frictionally coupled with respective walls of the first and second upper fastener apertures.

13. The method of claim 12, wherein the fasteners coupled with the second upper and lower fastener apertures are threadedly engaged therewith.

14. The method of claim 11 further comprising:
    aligning a first press fit tab of a second press fit stabilizer with a first upper fastener aperture formed in a second side of the housing of the first fan;
    aligning a second press fit tab of the second press fit stabilizer with a first lower fastener aperture formed in the second side of the housing of the first fan;
    aligning a third press fit tab of the second press fit stabilizer with a first upper fastener aperture formed in a second side of the housing of the second fan;
    aligning a fourth press fit tab of the second press fit stabilizer with a first lower fastener aperture formed in the second side of the housing of the first-second fan; and
    pressing the first, second, third, and fourth press fit tabs of the second press fit stabilizer into the first upper and lower fastener apertures of the second sides.

15. The method of claim 11 further comprising routing a wire assembly having a connector along a top of the first fan; and
    coupling the connector with a mating connector positioned within an interior volume of the enclosure.

16. The method of claim 11, wherein the first press fit tab comprises a main body portion; and
    wherein the first, second, third, and fourth press fit tabs extend from the main body portion in a same direction.

17. The method of claim 11, wherein each of the first, second, third, and fourth press fit tabs comprises:
    a leading edge; and
    a plurality of lateral edges; and
    wherein pressing the first, second, third, and fourth press fit tabs into the respective one of the first upper and lower fastener apertures of either the first fan or the second fan comprises pressing the first, second, third, and fourth press fit tabs into the respective one of the first upper and lower fastener apertures of either the first fan or the second fan to frictionally couple the plurality of lateral edges of the first, second, third, and fourth press fit tabs with an aperture wall of the respective fastener apertures.

18. The method of claim 11, wherein each of the first and second fans is configured to generate a cooling air flow along an air flow direction; and
    wherein the air flow direction of the first fan is a same as the air flow direction of the second fan in response to being coupled together.

19. The method of claim 18, wherein the air flow direction causes cooling air to flow from an ambient environment external to the enclosure toward an interior volume of the enclosure through the fan wall and through the housings of the first and second fans.

* * * * *